United States Patent
Vasko et al.

(10) Patent No.: US 8,519,435 B2
(45) Date of Patent: Aug. 27, 2013

(54) FLEXIBLE PHOTOVOLTAIC CELLS HAVING A POLYIMIDE MATERIAL LAYER AND METHOD OF PRODUCING SAME

(75) Inventors: Anthony Vasko, Toledo, OH (US);
Kristopher Wieland, Toledo, OH (US);
James Walker, Chagrin Falls, OH (US);
Alvin Compaan, Holland, OH (US)

(73) Assignee: The University of Toledo, Toledo, OH (US)

( * ) Notice: Subject to any disclaimer, the term of this patent is extended or adjusted under 35 U.S.C. 154(b) by 0 days.

(21) Appl. No.: 13/377,056

(22) PCT Filed: Jun. 8, 2010

(86) PCT No.: PCT/US2010/037788
§ 371 (c)(1),
(2), (4) Date: Jan. 30, 2012

(87) PCT Pub. No.: WO2010/144460
PCT Pub. Date: Dec. 16, 2010

(65) Prior Publication Data
US 2012/0153341 A1 Jun. 21, 2012

Related U.S. Application Data

(60) Provisional application No. 61/184,990, filed on Jun. 8, 2009.

(51) Int. Cl.
*H01L 31/102* (2006.01)
(52) U.S. Cl.
USPC ........... 257/184; 136/243; 136/244; 136/252; 136/258; 136/262; 136/265; 257/E25.007; 257/E27.124; 257/E27.125; 257/E31.126; 257/E33.064; 438/22; 438/85; 438/86; 438/94; 438/95; 438/98; 438/101

(58) Field of Classification Search
USPC ................. 136/243, 244, 262, 265, 252, 258; 257/184, E25.007, E27.124, E27.125, E31.126, 257/E33.064; 438/22, 85, 86, 94, 95, 98, 438/101
See application file for complete search history.

(56) References Cited

U.S. PATENT DOCUMENTS

| | | | |
|---|---|---|---|
| 4,611,091 A | 9/1986 | Choudary et al. |
| 4,612,411 A | 9/1986 | Wieting et al. |
| 4,798,660 A | 1/1989 | Ermer et al. |
| 4,915,745 A | 4/1990 | Pollock et al. |
| 5,078,804 A | 1/1992 | Chen et al. |
| 5,101,260 A | 3/1992 | Nath et al. |
| 5,393,675 A | 2/1995 | Compaan |
| 5,436,204 A | 7/1995 | Albin et al. |

(Continued)

OTHER PUBLICATIONS

PCT International Search Report and Written Opinion, Application No. PCT/US2010/037788, Dated Aug. 9, 2010.

(Continued)

*Primary Examiner* — Asok K Sarkar
(74) *Attorney, Agent, or Firm* — MacMillan, Sobanski & Todd, LLC

(57) ABSTRACT

A photovoltaic cell is fabricated onto a polyimide film using an unbalanced RF magnetron sputtering process. The sputtering process includes the addition of 0.05% to 0.5% oxygen to an inert gas stream. Portions of the photovoltaic cell are exposed to an elevated temperature $CdCl_2$ treatment which is at or below the glass transition temperature of the polyimide film.

31 Claims, 10 Drawing Sheets

(56) References Cited

U.S. PATENT DOCUMENTS

| | | | |
|---|---|---|---|
| 5,474,939 | A | 12/1995 | Pollock et al. |
| 5,909,632 | A | 6/1999 | Gessert |
| 5,972,527 | A | 10/1999 | Kaijou et al. |
| 6,040,521 | A | 3/2000 | Kushiya et al. |
| 6,184,057 | B1 | 2/2001 | Van Andel et al. |
| 6,331,672 | B1 | 12/2001 | Matsuda et al. |
| 6,372,538 | B1 | 4/2002 | Wendt et al. |
| 6,548,751 | B2 | 4/2003 | Sverdrup, Jr. et al. |
| 6,613,973 | B2 | 9/2003 | Mukai et al. |
| 6,852,614 | B1 | 2/2005 | Compaan et al. |
| 7,141,863 | B1 | 11/2006 | Compaan et al. |
| 7,179,527 | B2 | 2/2007 | Sato et al. |
| 2005/0009228 | A1 | 1/2005 | Wu et al. |
| 2005/0109392 | A1* | 5/2005 | Hollars ............... 136/265 |
| 2008/0308148 | A1 | 12/2008 | Leidholm et al. |
| 2009/0078318 | A1 | 3/2009 | Meyers et al. |

OTHER PUBLICATIONS

Haug, et al., "Influence of deposition conditions on the thermal stability of ZnO:Al films grown by rf magnetron sputtering", American Vacuum Society, J. Vac. Sci. Technol. A 19(1) Jan./Feb. 2011, pp. 171-174.

Kapton Polyimide Films, "Thin Film Substrates", DuPont Photovoltaic Solutions, www.dupont.com, Accessed May 21, 2009.

Mathew, et al., "CdTe/CdS solar cells on flexible substrates", Solar Energy, 2004, vol. 77, pp. 831-838.

Perrenoud, et al., "The use of aluminium doped ZnO as transparent conductive oxide for CdS/CdTe", Thin Solid Films, 2011, vol. 519, pp. 7444-7448.

Romeo, et al., "High-efficiency flexible CdTe solar cells on polymer substrates", Solar Energy Materials & Solar Cells, 2006, vol. 90, pp. 3407-3415.

Shao, et al., "Radio-frequency-magnetron-sputtered CdS/CdTe solar cells on soda-lime glass", American Institute of Physics, 1996, vol. 69, Supplement 20, pp. 3045-3047.

Tiwari, et al., "Flexible CdTe Solar Cells on Polymer Films", Progress in Photovoltaics: Research and Applications, 2001, vol. 9, pp. 211-215.

"Transparent, FLexible Substrates for LCD and Photovoltaic Applications", Akron Polymer Systems, www.akronpolysys.com, Accessed Jun. 2, 2009.

"Upilex Polyimide Films", Polyimides, UBE America, Inc., http://northamerica.ube.com, Accessed May 21, 2009.

* cited by examiner

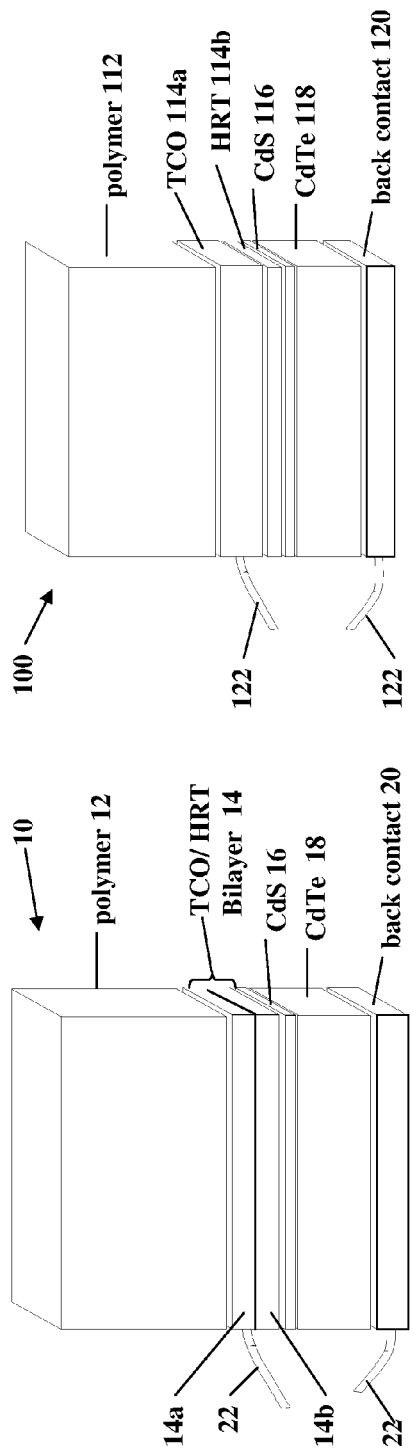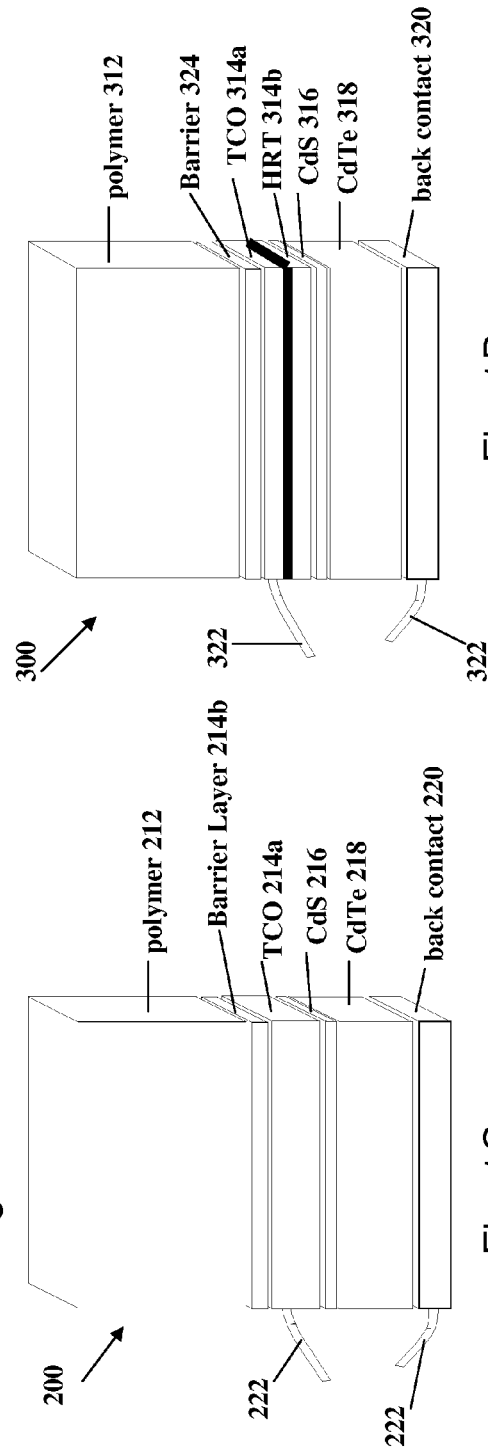

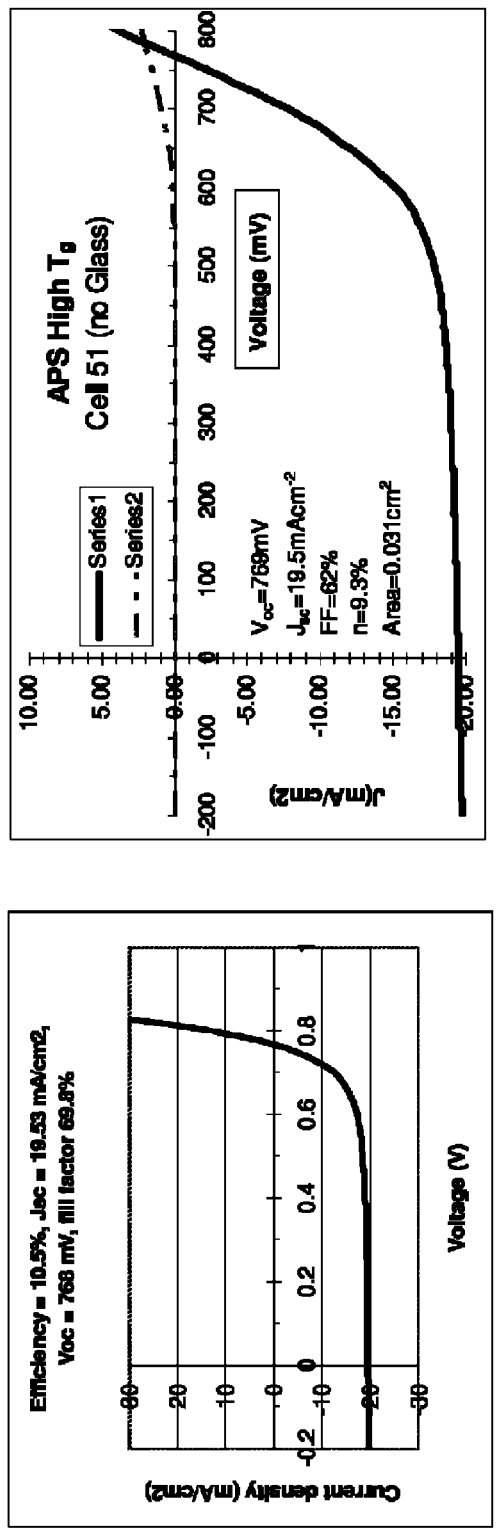
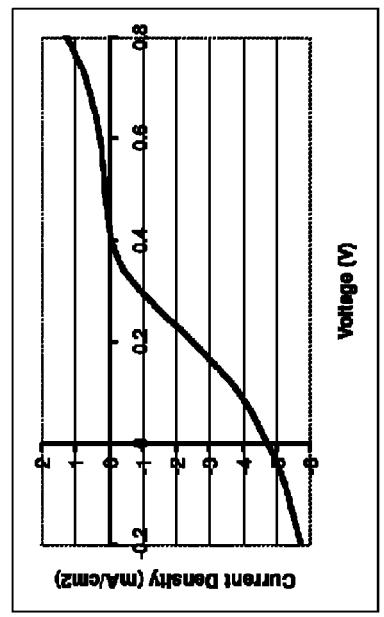
Fig. 3B
Fig. 3C
Fig. 3A

FLEXIBLE PHOTOVOLTAIC CELLS HAVING A POLYIMIDE MATERIAL LAYER AND METHOD OF PRODUCING SAME

CROSS-REFERENCE TO RELATED APPLICATIONS

The present invention claims the benefit of PCT application No. PCT/US2010/37788 filed Jun. 8, 2010 which claims priority to the provisional patent application Ser. No. 61/184,990 filed Jun. 8, 2009.

STATEMENT REGARDING FEDERALLY SPONSORED RESEARCH

This invention was made with U.S. government support under U.S. Air Force Kirtland Research Grant No. F29601-02-C-0304-BAA awarded by the United States Air Force. The government has certain rights in this invention.

FIELD OF THE INVENTION

The present invention relates generally to photovoltaic cells and methods for the fabrication thereof. More particularly, the present invention relates to a polymer for use as a substrate medium to support photovoltaic cell components.

BACKGROUND OF THE INVENTION

There is no admission that the background art disclosed in this section legally constitutes prior art.

This invention provides improvements to photovoltaic cells and to processes for making them.

It is well known that solar cells or photovoltaic cells can be used to convert solar energy into electric current. Typical photovoltaic cells include a substrate layer for mounting the cell and two ohmic contacts or electrode layers for passing current to an external electrical circuit. The cell also includes an active semiconductor junction, usually comprised of two or three semiconductor layers in series. The two layer type of semiconductor cell consists of an n-type layer and a p-type layer, and the three layer type includes an intrinsic (i-type) layer positioned between the n-type layer and the p-type layer for absorption of light radiation. The photovoltaic cells operate by having readily excitable electrons that can be energized by solar energy to higher energy levels, thereby creating positively charged holes and negatively charged electrons at the interface of various semiconductor layers. The creation of these positive and negative charge carriers applies a net voltage across the two electrode layers in the photovoltaic cell, establishing a current of electricity.

Solar cells or photovoltaic cells are examples of diode structures where light passes through a transparent electrode layer and energizes an active semiconductor junction. The diode structure can also take on a different mode, where the current is applied to the transparent electrode layers of a layered semiconductor cell, and the output is light energy. In such a case the diode structure is a light emitting diode (LED). In a specific example of this type of diode structure, the light emitting diode is incorporated into a flat panel display. Another area where the diode structure of the invention can be used is in energy efficient coatings for glass.

The semiconductor layers of diode structures may be formed from single crystalline materials, amorphous materials, or polycrystalline materials. Single crystalline layers are often made with a molecular beam epitaxy (MBE) process or other vapor deposition processes such as, for example, metal-organic chemical vapor deposition (MOCVD). The largest area of a substrate, however, that can be practically covered using such processes is on the order of several tens of square centimeters. The area of coverage is limited by the size of single crystal substrates, which is an impractical size when considering the surface area required for economically practical photovoltaic cells.

Therefore, although single crystal photovoltaic materials can be used to generate conversion efficiencies over 20 percent, they have significant drawbacks because of their high manufactured cost. Accordingly, where photovoltaic cells compete with conventional electricity generation by nuclear or fossil fuel, polycrystalline and amorphous materials are viewed as the material of choice, rather than crystalline materials, for the production of semiconductors and photovoltaic cells using such semiconductors.

Often, the polycrystalline material of choice for a semiconductor in a photovoltaic cell is a group II-group VI compound, such as cadmium telluride. Cadmium telluride is preferred for thin film photovoltaic applications because of its direct band gap of 1.5 electron volts, which is well matched to the solar spectrum, and its ability to be doped in n-type and p-type configurations, which permits formation of a variety of junction structures. P-type cadmium telluride is also compatible with n-type semiconductor partners, such as cadmium sulfide, to form heterojunction photovoltaic cells.

In most photovoltaic cells it is necessary to dope one or more semiconductor layers to be highly conductive to achieve easy flow of electrons and holes into the respective contact electrodes. Particularly for cadmium telluride and zinc telluride and related semiconductors, copper is often used for this dopant. While the doping with copper is successful in obtaining the desired conductivity, the use of copper has its limitations. It has been found that, over time, the copper diffuses into other semiconductor layers of the photovoltaic cell, thereby causing a loss in efficiency. When copper is used to dope a zinc telluride contacting layer, the copper tends to move into the cadmium telluride layer and even penetrate into the cadmium sulfide/cadmium telluride junction where it degrades the photovoltaic activity.

There are certain characteristics of the transparent electrode layers that impact the ability to pass current to the external electrical circuit in diode structures. Some notable characteristics of these electrode layers are a capability to: 1) conduct electricity to and from the diode structure, and 2) be substantially transparent to certain light wavelengths (typically greater than 400 nm and less than 850 nm) so that the solar energy can reach the primary semiconductor layers that form the active semiconductor junction.

In many cases, the restriction on the amount of light that can pass through the electrode/window layer sets a practical limit on the efficiency of the photovoltaic cell. Also, the electrical conductivity of the electrode layer impacts the overall efficiency of a photovoltaic cell. Diminished conductivity of the transparent electrode layers reduces the efficiency of the photovoltaic cell.

Cadmium telluride photovoltaic cells are traditionally built on glass in a superstrate configuration, taking advantage of glass's transparency, mechanical rigidity and the advantage of forming the back contact last. However, glass is heavy and its rigidity and fragility are disadvantages for many applications. Polyimide polymer films offer an alternative medium to glass, where their generally less transparent characteristic in the blue and green wavelengths is offset by their greater flexibility and reduced weight. Subsequent processing of polyimides, however, further reduces transparency thus affecting photovoltaic cell efficiency.

It would be advantageous if there could be developed improved diode structures, such as solar cells or photovoltaic cells, and such as LED's. In particular, improved diode structures would advantageously exhibit increased efficiency due to improvements in the transparency of the transparent electrode layers, the conductivity of the transparent electrode layers, or both.

Various methods have been developed that deposit films on glass using high temperature, such as is shown in U.S. Pat. No. 6,548,751 to Sverdrup, et al. Another method is described in U.S. Pat. No. 5,393,675 to Compaan, entitled "Process for RF Sputtering of Cadmium Telluride Photovoltaic Cell." Additionally, a method is also described in U.S. Pat. No. 6,852,614 to Compaan et al. entitled, "Method of manufacturing semiconductor having group II-group VI compounds doped with nitrogen." Still another method uses magnetron sputtering on glass as described in U.S. Pat. No. 7,141,863 to Compaan et al. entitled "Method of making diode structures."

Thus, it would be advantageous if there could be developed an improved photovoltaic cell that can be efficiently and economically produced.

SUMMARY OF THE INVENTION

In a broad aspect, there is provided herein a photovoltaic cell that is fabricated onto a polyimide film using an unbalanced RF magnetron sputtering process. In certain embodiments, the sputtering process includes the addition of 0.05% to 0.5% oxygen to an inert gas stream. Portions of the photovoltaic cell are exposed to an elevated temperature $CdCl_2$ treatment which is at or below the glass transition temperature of the polyimide film.

The method described herein provides still further improvements in the method for making photovoltaic cells that includes improvement in the sputter deposition process and in the postdeposition chloride annealing process.

In another broad aspect, a method of making a photovoltaic cell comprises providing a superstrate layer that comprises a polymer material having a first light transmission characteristic, as measured in light transparency. A transparent conductive oxide (TCO) layer having a first sheet resistance characteristic, as measured in ohms, is deposited onto the superstrate layer. A semiconductor junction, having at least an n-type layer and at least a p-type layer, is deposited onto the TCO layer under process conditions that avoid substantial degradation of the TCO layer. The semiconductor junction is exposed to a $CdCl_2$ treatment sufficient to i) cause the superstrate layer to take on a second light transmission characteristic, and ii) cause the TCO layer to take on a second sheet resistance characteristic. The at least one of the second light transmission characteristic and the second sheet resistance characteristic permit a photovoltaic cell efficiency of at least about 9%. Finally, a back electrode coating layer is applied to the semiconductor junction.

In one embodiment of the first aspect, the step of exposing the semiconductor junction to the $CdCl_2$ treatment is controlled such that one of a treatment temperature and a treatment exposure time causes one of the second light transmission characteristic to be about 90% of the first light transmission characteristic in a range of about 600 nm to about 800 nm of light wavelength and the second sheet resistance to increase at greater than a linear rate from the first sheet resistance characteristic.

In other embodiments, the treatment temperature may be in a range of about 350° C. to about 400° C. and the treatment exposure time may be in a range of about 15 minutes to about 60 minutes.

In yet other embodiments, the step of providing the superstrate layer includes providing the polymer as a polyimide material and either casting the polyimide material onto a glass fixture or providing the polymer as a polyimide material as a free-standing sheet material.

In other embodiments, the step of depositing the TCO layer may include forming the TCO layer from one or more of ZnO, ZnS, CdO, $SnO_2$:F, $In_2O_3$:Sn (ITO), and $CdSn_2O_4$. Additionally, the step of forming the TCO layer may also include forming a highly resistive transparent (HRT) layer. In certain embodiments, the HRT layer is formed by introducing an inert gas stream with an oxygen content that reacts with a TCO precursor. The TCO precursor may include one of a Zn, Al, and O element, forming a resistance layer on either or both sides of the TCO. The resistance layer may then be deposited in a manner sufficient to substantially limit degradation of the TCO layer. Any degradation to the TCO layer may be limited to the extent that the electrical sheet resistance of the TCO layer is between 5 and 8 ohms and the transparency is greater than about 85 percent of visible light.

In yet another broad aspect, a method of producing a photovoltaic cell comprises providing a polymer film and a magnetron sputtering gun having an unbalanced field. The polymer film may be bombarded by way of an RF sputtering technique using the magnetron gun. The RF sputtering technique includes providing an argon gas stream that includes oxygen. The method further includes applying a plurality of layers that include at least one of a TCO, an HRT, a p-type layer and an n-type layer; and applying a back contact layer to form the photovoltaic cell.

In an embodiment of the broad aspect, a polyimide film is provided and exposed to a $CdCl_2$ treatment. The $CdCl_2$ treatment may include raising the temperature of the polyimide film to less than 400 degrees C. and limiting the polyimide film to less than 40 minutes exposure time to the $CdCl_2$ vapors.

In another embodiment, a TCO layer may be provided as a ZnO layer doped with at least one of an aluminum material or an aluminum oxide material. Further, the $CdCl_2$ treatment may include treating the TCO layer such that the TCO increases an electrical resistance characteristic. Alternatively, in another embodiment, the TCO layer and the HRT layer may be formed as a TCO/HRT bilayer.

Various aspects of this invention will become apparent to those skilled in the art from the following detailed description of the preferred embodiment, when read in light of the accompanying drawings.

BRIEF DESCRIPTION OF THE DRAWINGS

FIG. 1A is a schematic view of an embodiment of a photovoltaic cell having an alternative cell stack arrangement.

FIG. 1B is a schematic view of an alternative embodiment of a photovoltaic cell having an alternative cell stack arrangement.

FIG. 1C is a schematic view of another alternative embodiment of a photovoltaic cell having an alternative cell stack arrangement.

FIG. 1D is a schematic view of yet another alternative embodiment of a photovoltaic cell having an alternative cell stack arrangement.

FIG. 3A is a plot of current density versus voltage of a photovoltaic cell having a first embodiment polyimide layer (Upilex).

FIG. 3B is a graph, similar to FIG. 3A, of a photovoltaic cell having a second embodiment polyimide layer (APS).

FIG. 3C is a graph of a J-V curve of a cell after $CdCl_2$ treatment.

DETAILED DESCRIPTION OF THE PREFERRED EMBODIMENT

Figure 2:
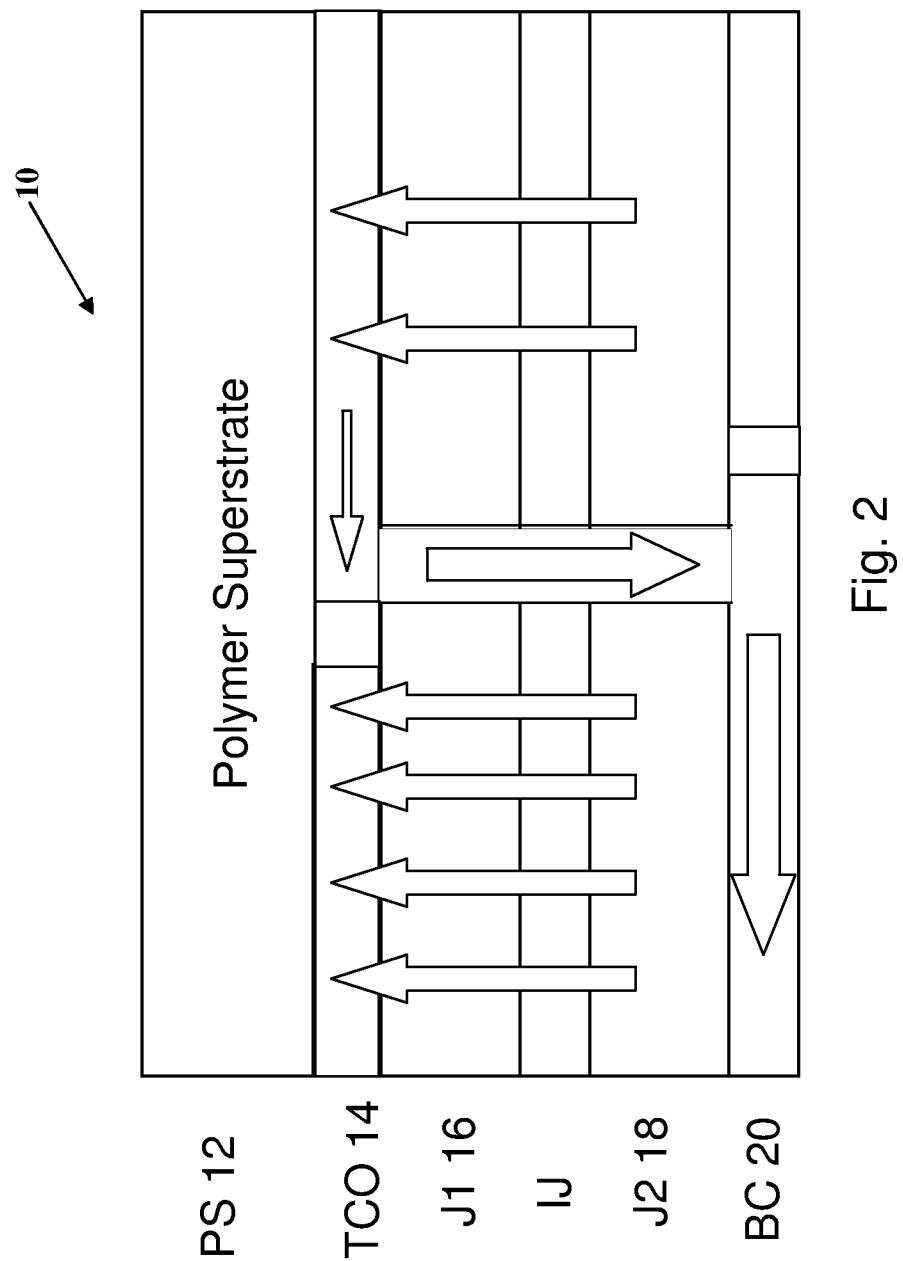
FIG. 2 is a schematic view of a photovoltaic mini-module with monolithic interconnection showing an embodiment of an electron flow path.

In a first aspect, there is provided herein a cadmium sulfide/cadmium telluride (CdS/CdTe) photovoltaic cell (PV), shown generally at 10, that is fabricated on a transparent polymer (polyimide) superstrate 12 and using a magnetron sputter deposition process for various semiconductor layers. The transparent polymer superstrate 12 acts as a front window of the cell and admits light energy to the PV cell layers below. Thus, the transparency of the front window layer 12 is an influential factor in the overall performance and efficiency of the PV cell 10.

Improvements to the performance of certain layers, some of which are deposited by magnetron sputtering onto polyimide superstrates or substrates, may be realized over those described in U.S. Pat. No. 7,141,863 to Compaan et al. entitled "Method of Making Diode Structures", the disclosure of which is incorporated herein by reference in its entirety. Some of the improvements over U.S. Pat. No. 7,141,863 relate to the stack arrangement, or specific layer composition and orientation, as shown in FIGS. 1A-1D as will be described in detail below. Other improvements relate to processing techniques developed beyond the disclosure of U.S. Pat. No. 7,141,863.

In certain embodiments, the photovoltaic cells described herein have a sunlight-to-electrical-power conversion efficiency of approximately 9%, making this photovoltaic cell a commercially viable alternative to present photovoltaic cells. In other certain embodiments, the photovoltaic cells described herein may have a sunlight-to-electrical-power conversion efficiency of approximately 10% or greater.

In one non-limiting example, the structure of the photovoltaic cell 10 is shown in FIG. 1A. The polymer film layer 12 can be a polyimide polymer material such as, for example, Kapton®, made by DuPont; Upilex®, made by Ube Industries, Ltd.; and/or polyimide films prepared by Akron Polymer Systems. The polyimide film layer 12 is shown oriented as a front window or first layer of the photovoltaic cells of FIGS. 1A-1D. It should be understood that the polymer layer 12 may be positioned at other points on the cell 10 such as, for example, between the back contact and the CdTe layer or as an outmost layer behind the back contact. In an alternative embodiment of the photovoltaic cell, the polymer layer 12 is an electrically conductive polymer layer that forms a back contact of the cell. The same or similar reference numbers are used to indicate the same or similar configurations of the various embodiments of photovoltaic cells, described herein.

The PV cell 10 also includes a transparent conducting oxide (TCO) and highly resistive transparent (HRT) bilayer 14, an n-type semiconductor layer 16, which is shown as a CdS layer, a p-type semiconductor layer 18, which is shown as a CdTe layer, and a back contact 20. The TCO/HRT bilayer 14 is configured as a combination of a TCO layer 14a, which is electrically conductive, and an HRT layer 14b, which is electrically resistive and may chemically isolate the TCO material from diffusible elements that may cause reduced cell performance over time. The constituents of the TCO/HRT bilayer 14 are intermixed to form a generally seamless layer. Leads 22 are connected to the TCO/HRT bilayer 14 and the back contact 20 to provide electrical communication with an external load (not shown).

Referring now to FIG. 1B, there is illustrated another embodiment of a PV cell, shown generally at 100. The PV cell 100 includes a polymer front window 112, a TCO layer 114a, an HRT layer 114b, a CdS layer 116, a CdTe layer 118, and a back contact 120. The layers of the PV cell 100 may be configured and constructed similarly to the layers of PV cell 10, though such is not required. The TCO layer 114a is formed separately from the HRT layer 114b and is applied onto the polymer front window 112. Electrical contact with the external load is formed by leads 122.

Referring to FIG. 1C, a PV cell 200 is illustrated having a similar polymer front window layer 212 to the other PV cell embodiments described herein. The PV cell 200 includes a barrier layer 214b that is formed onto the polymer layer 212. The barrier layer 324 may be configured as a diffusion barrier to prevent diffusion of constituents that degrade PV cell performance over time. Then, a TCO layer 214a is formed onto the barrier layer 214b. Active semiconductor layers of a CdS layer 216, forming an n-type layer, and a CdTe layer 218, forming a p-type layer, are applied between the TCO layer 214a and a back contact layer 220. Similarly, electrical leads 222 transfer electrical power to drive the external load.

Referring to FIG. 1D, a PV cell 300 includes a polymer front window layer 312 that is chemically isolated from subsequently applied layers by a barrier layer 324. A TCO layer 314a, an HRT layer 314b, a CdS layer 316, a CdTe layer 318, and a back contact 320 may be structured and arranged in a similar manner to the other PV cell embodiments described herein. Leads 322 form the electrical connections for power transfer from the PV cell 300 to an external load.

Figure 4:
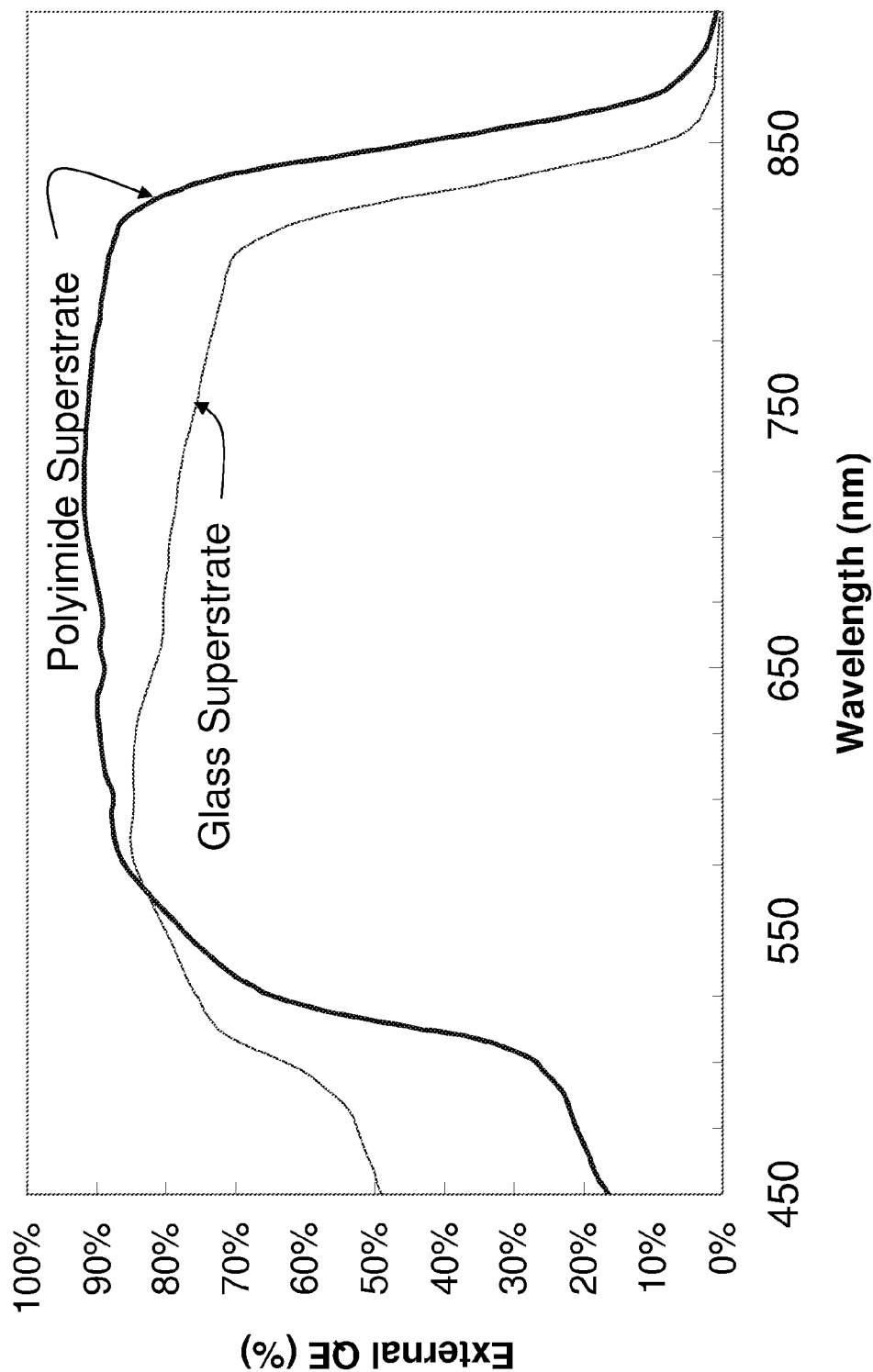
FIG. 4 is a graph of spectral quantum efficiency of a photovoltaic cell having the second embodiment polyimide layer.

Any embodiment of the PV cells 10, 100, 200, and 300 may be fabricated using sputtered zinc oxide doped with aluminum as the TCO layer. Other materials may be used in the TCO layer such as, for example, indium tin oxide, cadmium tin oxide, fluorine-doped tin oxide, and the like. Additionally, the CdS and CdTe layers were also deposited through the sputtering process. Cell efficiencies of 10.5% have been achieved at light intensity conditions of air mass 1.5G illumination. These results can be compared favorably with cells made using other materials and processing techniques, such as soda-lime silica glass with tin oxide doped with fluorine as the transparent conductive oxide layer and sputtered deposition of the CdS and CdTe layers. FIG. 4 illustrates comparative quantum efficiencies of photovoltaic cells having a polyimide superstrate (thick line) versus a glass superstrate (thin line). The higher response from 600 nm to 850 nm of the polyimide superstrate is due to better transparency of the polyimide film over this wavelength range. The lower response from 450 nm to 550 nm is due to a lower transparency of the polyimide.

It is to be noted that cells processed on Kapton® material may yield reduced performance due to influences of off-color tinting, such as a yellow tint, when exposed to processing agents such as cadmium chloride ($CdCl_2$) at specified temperatures and exposure durations, and a higher blue spectrum absorption. Also, cells processed on Upilex® showed improved efficiencies of about 10.3%, which is greater than those formed on Kapton® materials. These results may be influenced by film forming techniques such as, for example, casting of the polyimide film onto a glass layer (some examples used a 1 mm thick glass layer) versus use of a free standing polymer fabrication technique, as will be described below. Thus, in one embodiment of a method of producing photovoltaic cells onto polymer substrates, the polymer is first cast onto a glass fixture. The polymer casting process is generally characterized by drawing a knife edge, such as the knife edge of a doctor blade, over the polymer material that is applied to the surface of the glass. The knife edge is spaced apart from the glass, for example by spacers at either end of the knife, and subsequently drawn or moved over the polymer material (in a squeegee-like manner) to create a thin film of material.

In an alternative embodiment of the method, the polymer is provided as a free standing layer without the benefit of a glass fixture. Selection of the appropriate fixturing embodiment may be driven by the specific polymer chemistry. Such a selection criteria may involve, for example, balancing the glass transition temperature ($T_g$), the mechanical properties of the polymer before and after RF sputtering exposure, and the surface texture characteristics of the polymer exhibited after casting or in the free standing state prior to RF sputtering exposure. In balancing the factor of surface texture, greater fine scale roughness may improve adhesion of subsequently deposited layers. However, large scale roughness or large asperities may cause pinholes and shorts within the cell structure thus reducing output performance. Such shorts affect the electron flow path, which is shown in the operative state in FIG. 2.

The inventors herein now show that a sample where the polymer was removed from the glass showed that the $J_{SC}$ increases by almost 0.5 $mA/cm^2$, giving an efficiency of 9.3% (several cells were above 9%). These samples had a polymer substrate with a 370° C. glass transition temperature ($T_g$) and about a 50 μm thick polyimide which remained on the glass during processing. In other tests, the inventors successfully produced ~40 working test cells on this polymer sheet with efficiencies ranging from ~3.5→5%. For these examples, the cells were processed using in a $CdCl_2$ treatment having a peak temperature of 370 C and an exposure time of approximately 30 minutes.

Figure 5A:
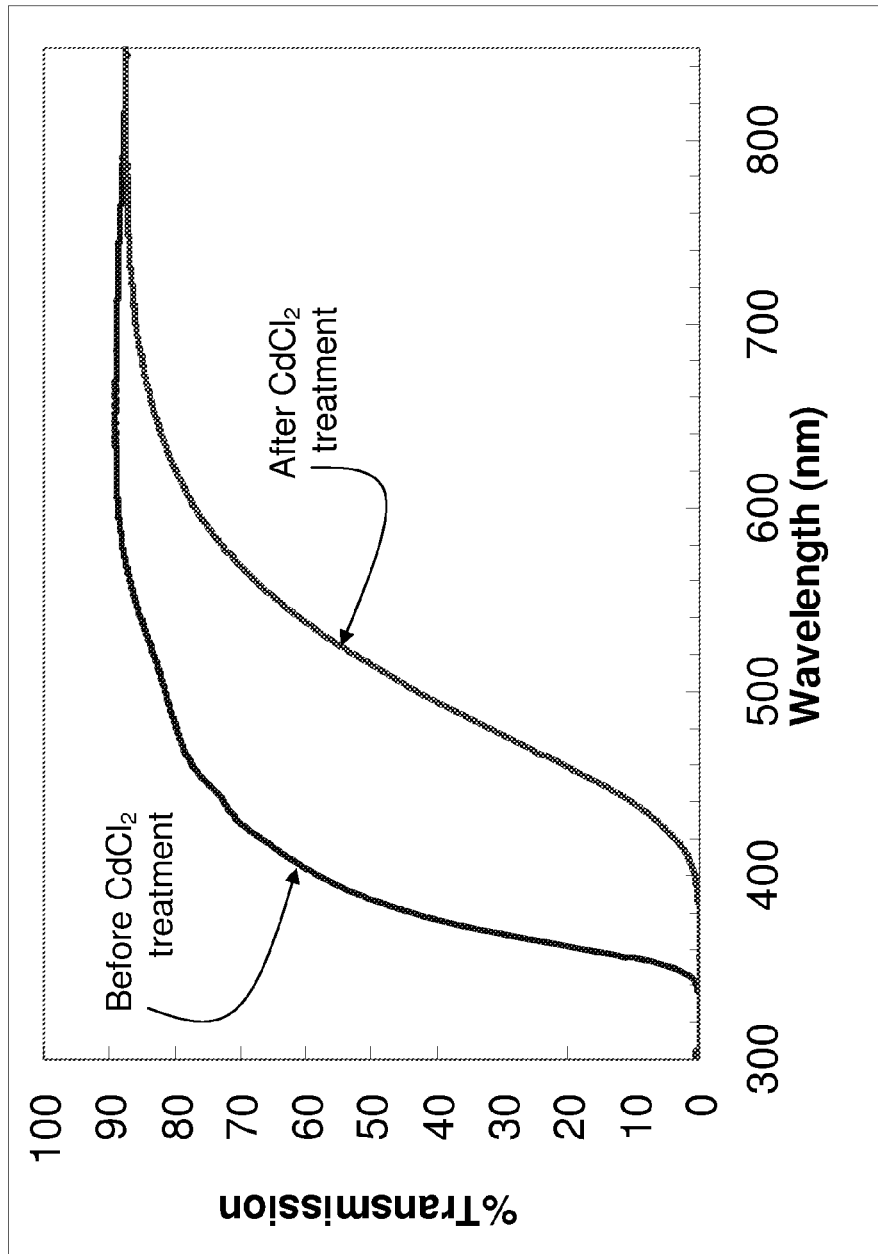
FIG. 5A is a graph of ZnO/polyimide sheet transmission before and after $CdCl_2$ treatment.
Figure 5B:
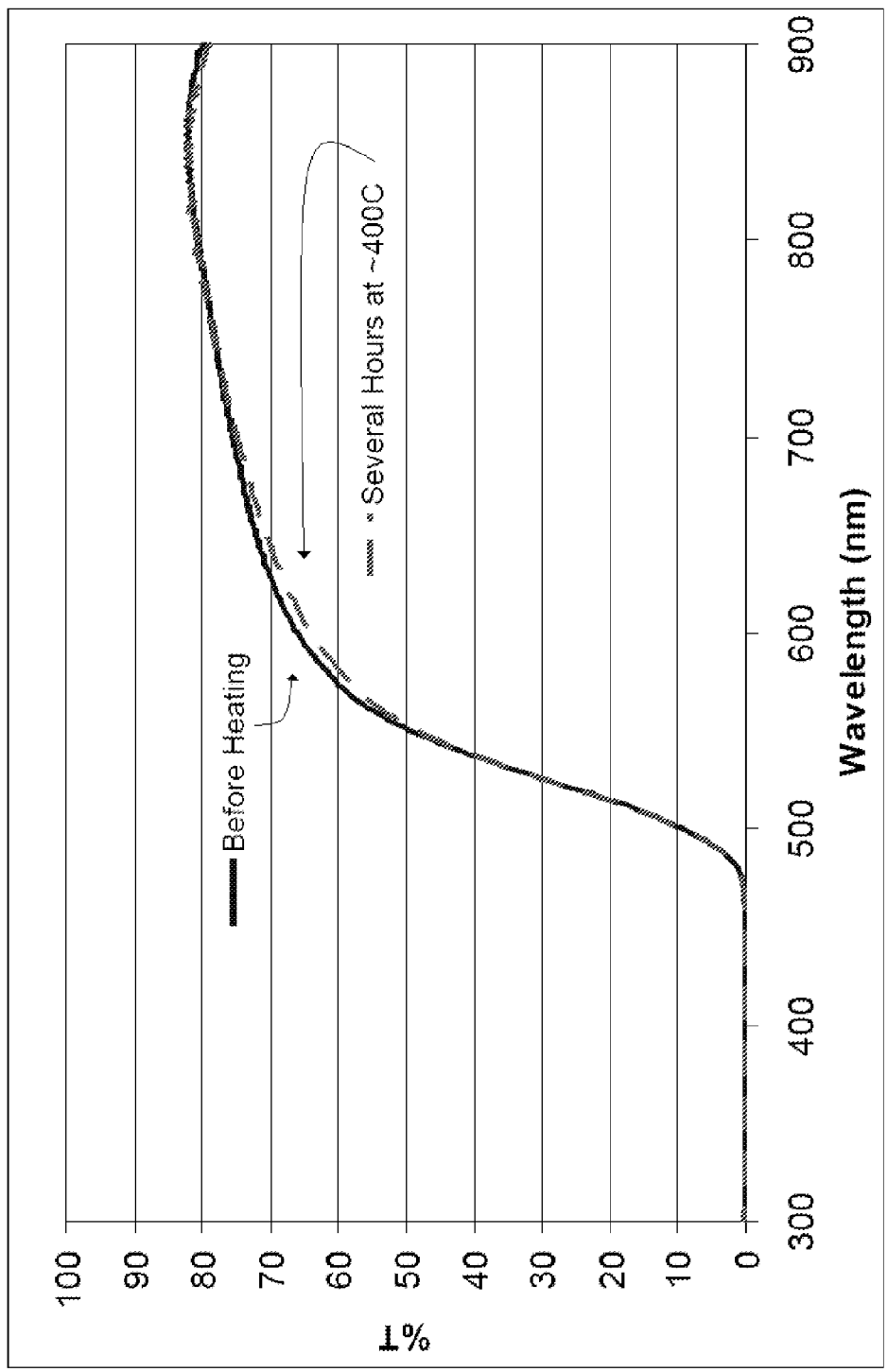
FIG. 5B is a graph of a 50 mm polyimide sample sheet transmission before and after 400° C. $CdCl_2$ treatment.

FIG. 5A shows the transmission characteristics of a polymer coated with ZnO:Al before and after $CdCl_2$-treatment. This comparison indicates that some polymers are susceptible to loss of transmissibility due to the $CdCl_2$ treatment. It is to be noted that light harvested by the photovoltaic cells comes through the polymer/ZnO:Al used as a superstrate. FIG. 5B shows that there has been only minimal transmission lost after the $CdCl_2$ treatment with certain polymer materials when processed according to the method described herein. The results of exposing a 50 mm sample of Kapton® to a 400° C. $CdCl_2$ treatment shows a minimal effect on the percent transmission of light through the material, before and after exposure. Good light transmission characteristics improve output efficiencies, particularly in the light wavelength range from 450 nm→850 nm and to a lesser extent from 350 nm→450 nm.

Figure 7A:
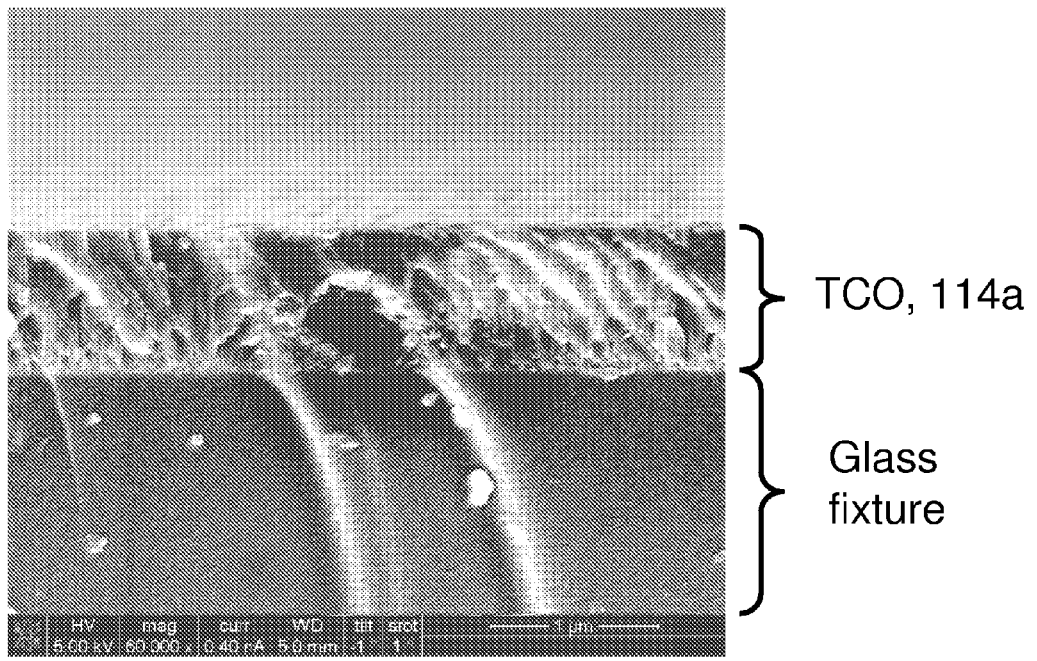
FIG. 7A is a photograph of a ZnO sheet before $CdCl_2$ treatment.
Figure 7B:
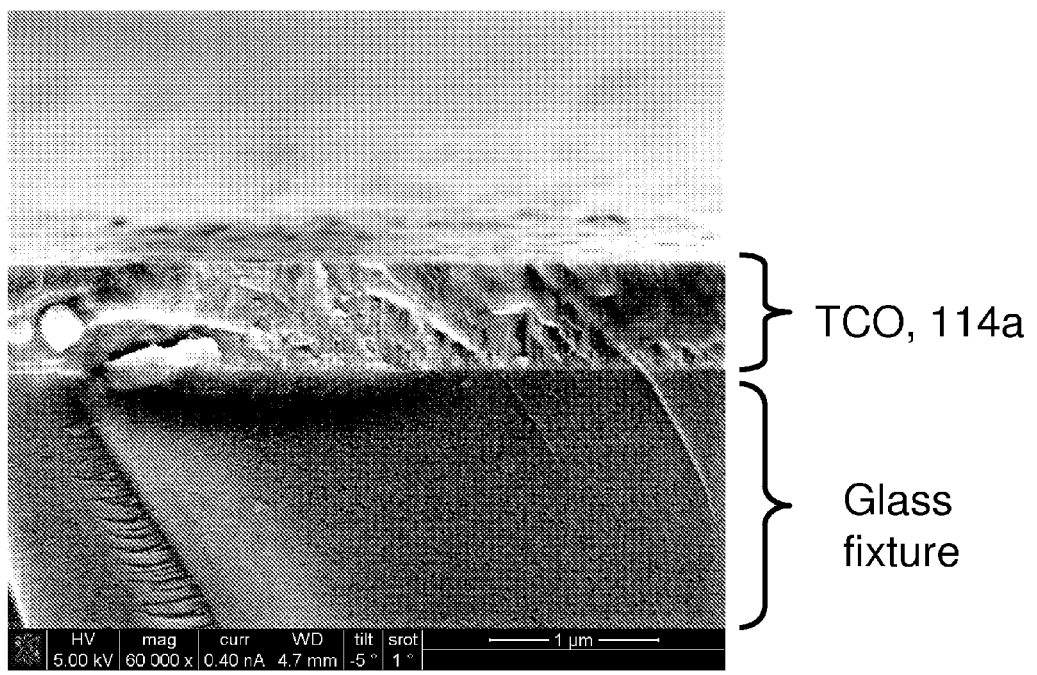
FIG. 7B is a photograph of the ZnO sheet of FIG. 7A after $CdCl_2$ treatment.

As is shown in FIG. 4, the quantum efficiency of the polyimide-based cell ("y-axis"), i.e., the number of electrons produced divided by the number of photons incident on the cell, is at a maximum value over much of the desired light wavelength range of 500-820 nm. This efficiency is proportional to the amount of light transmitted to the active semi-conductor heterojunction interface. Such light transmission is due to the effects of polymer transparency after the $CdCl_2$ treatment. FIGS. 7A and 7B show scanning electron microscope images of a ZnO layer 114a, applied to a glass layer, before and after $CdCl_2$ treatment, where no obvious structural changes are evident.

Figure 6A:
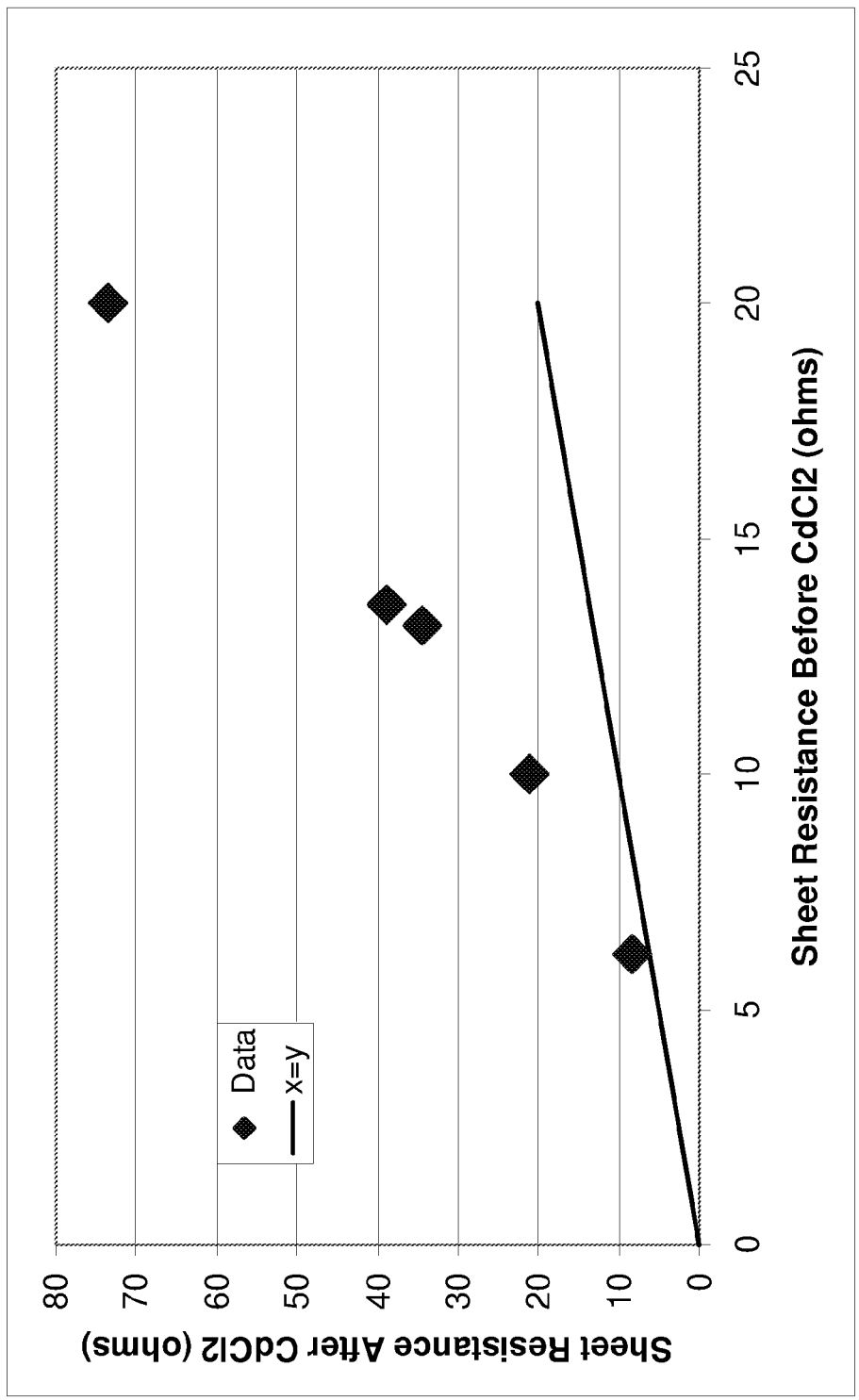
FIG. 6A is a graph showing changes in sheet resistance of various ZnO films after $CdCl_2$ treatment.
Figure 6B:
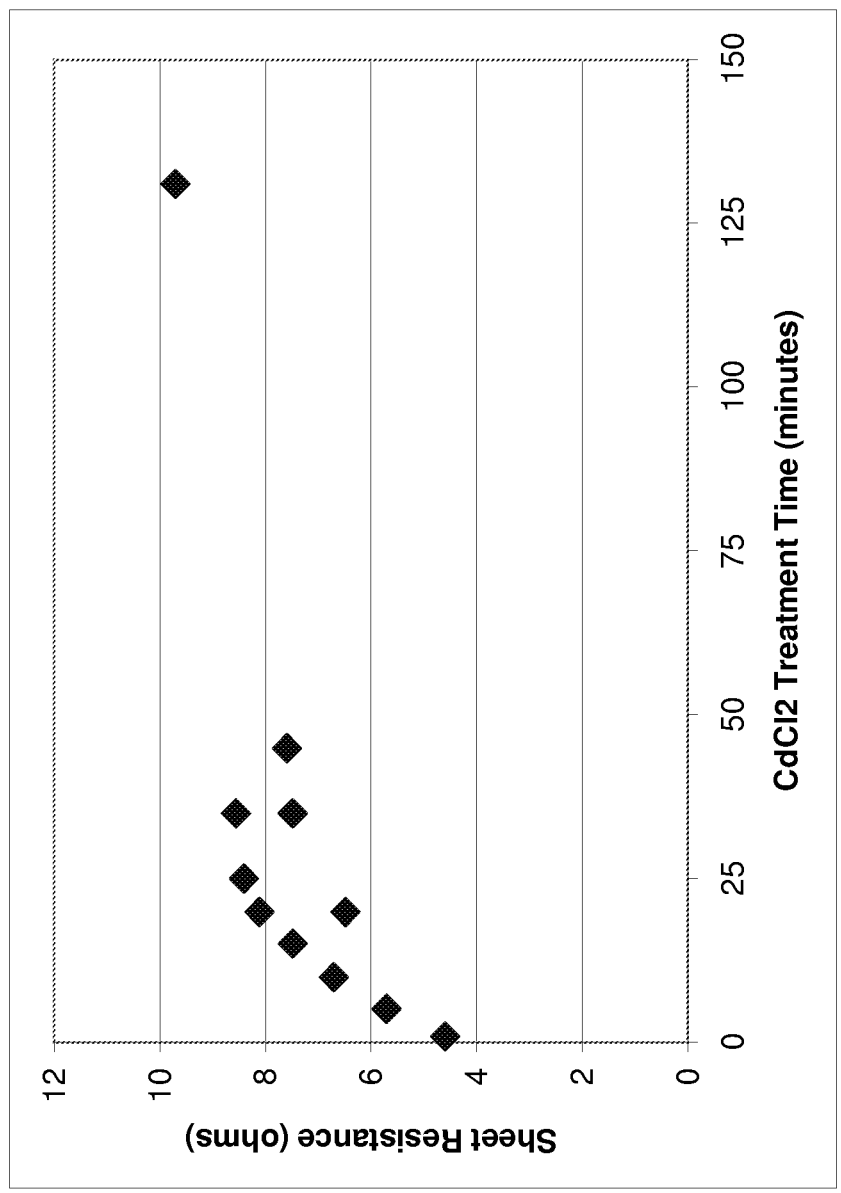
FIG. 6B is a graph showing the effect of repeated $CdCl_2$ treatment to a single sample on ZnO sheet resistance.

Referring now to FIGS. 6A and 6B, exposure to the $CdCl_2$ treatment may cause some increased resistivity in the outer layers of the aluminum doped ZnO layer (ZnO:Al or AZO). FIG. 6A illustrates the effect of $CdCl_2$ treatment on various ZnO films. The curve shows the sensitivity of some materials to $CdCl_2$ exposure versus other films. FIG. 6B illustrates the effect of $CdCl_2$ treatment time on sheet resistance of a single sample that has been repeatedly exposed. As can be seen from FIG. 6B, the increase in sheet resistance becomes "saturated" after long treatment times. Furthermore, the increase in resistivity does not change linearly as treatment time increases. $CdCl_2$ processing temperatures previously used in conjunction with glass substrates are above the $T_g$ of certain polyimide films. The data of FIG. 6B is consistent with the $CdCl_2$ causing an increase in resistivity of the film material with changes which proceed from the outer surfaces inward until the entire film has been converted to higher resistivity. Among the affected properties is the transmissibility to light where the film darkens at the higher processing temperatures. Thus, a balancing requirement has been found between the $T_g$ of the film, the $CdCl_2$ processing temperature, and the exposure time. The inventors have had success with higher $T_g$ polymers. Using thinner polyimide films may assist to reduce darkening resulting from the $CdCl_2$ process. Additionally, process conditions may be adjusted to control darkening of thicker films.

Referring back to FIGS. 1A-1C, the layers and the layering order of the cell have an impact on the efficiency of the resulting photovoltaic cell. The inventors herein now use a highly resistive transparent (HRT) layers made of an undoped ZnO material or $Al_2O_3$ material to provide both an electrical isolation function and a chemical diffusion barrier function. In an embodiment of the photovoltaic cell shown in FIG. 1A, the TCO/HRT bilayer may use a ZnO:Al/ZnO bilayer where the ZnO:Al portion functions as the TCO layer and the undoped portion of ZnO functions as the HRT layer.

Based on specific parameters of the RF sputtering process, the Al-doped ZnO, or ZnO:Al ("AZO") may be converted to more resistive material due to the use of oxygen (typically 6% $O_2$ and 94% Ar) during sputtering for this layer. It is also possible that the added oxygen suppresses native n-type doping of ZnO, by either reducing oxygen vacancies or (by lowering the relative ratio of Zn to O) by reducing Zn interstitials, either of which could otherwise act as donors. Without the added oxygen, the aluminum "dopes" the ZnO with the valence 3 Al substituting for the valence 2 Z, as an n-type semiconductor layer producing ZnO:Al. The HRT layer may have some residual doping but it is very low so the layer is highly resistive. In another embodiment as shown in FIG. 1A, the TCO/HRT bilayer can be successfully formed by way of a single target with the addition of a small amount of oxygen ($O_2$) to the argon (Ar) sputter gas.

Figure 8:
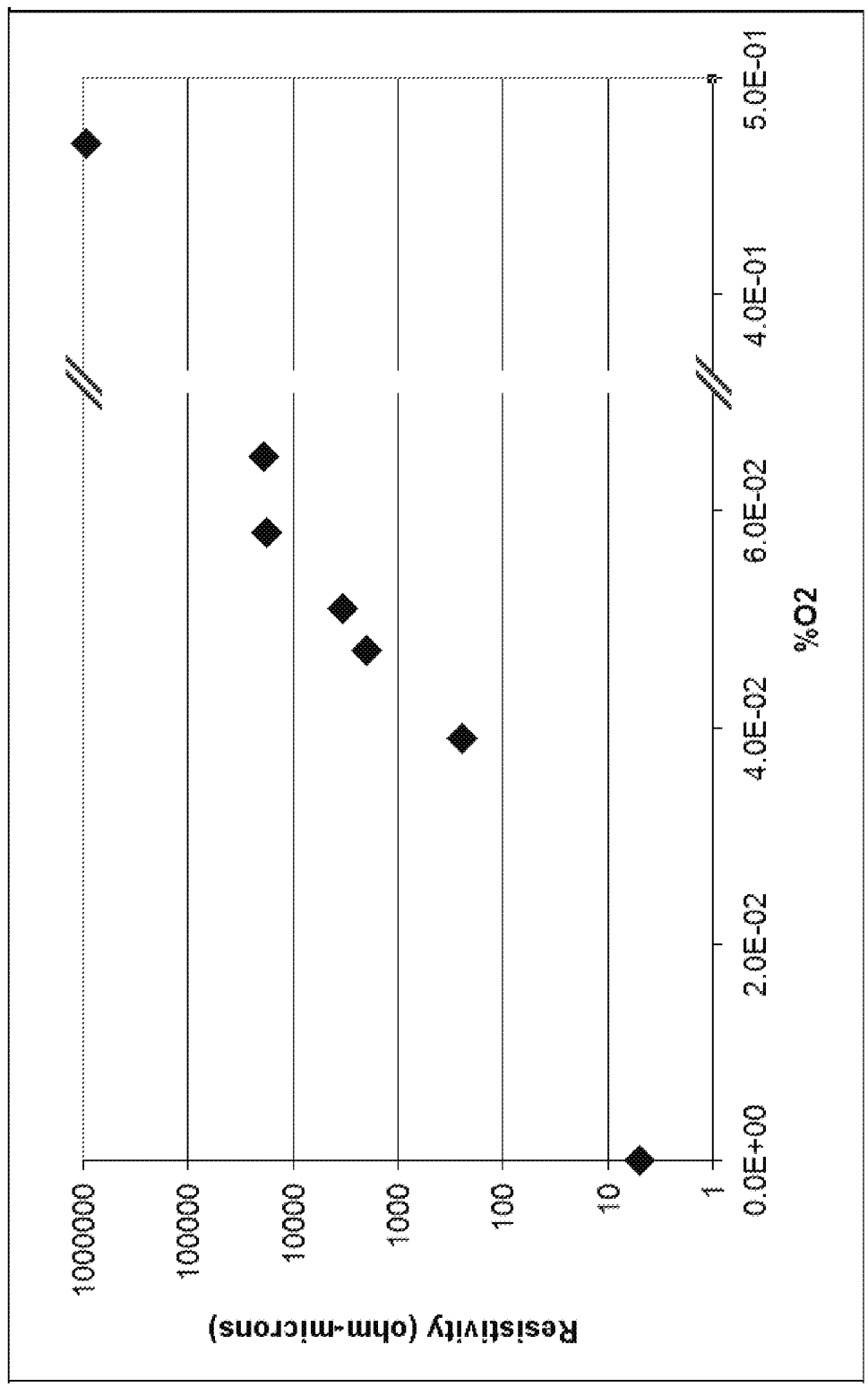
FIG. 8 is a graph showing the dependence of resistivity of reactively sputtered ZnO films from a doped target versus Oxygen percentage in sputtering gas.

FIG. 8 shows the effect of the addition of $O_2$ into the sputtering gas on the resistivity of the AZO films. As an additional benefit, the ZnO HRT layer provides a diffusion barrier function, when deposited under certain conditions, such as under low pressure, substrate voltage bias, and magnetic field conditions that produce compact, dense films. To prevent migration of dopant materials, especially migration of copper and to a lesser extent aluminum into adjacent layers (such as CdTe and CdS layers, for example), the inventors herein have now discovered that the added diffusion barrier functionality of the HRT layer reduces layering requirements which, in turn, benefits cell formation on polymer substrates/superstrates.

The diffusion barrier HRT layer can provide chemical isolation in different ways. In a first barrier arrangement shown in FIG. 1C, the HRT diffusion barrier layer acts as a diffusion barrier in the cell structure layer arrangement of a polyimide/HRT/AZO/remaining cell layer structure. In this arrangement, the HRT diffusion barrier layer provides a barrier to contaminants in the substrate (or superstrate) layer from diffusing into the AZO layer, which would otherwise make the AZO less conductive.

In a second barrier arrangement shown in FIGS. 1A and 1B, the HRT layer acts as a diffusion barrier in the cell structure layer arrangement of a polyimide/AZO/HRT/remaining cell layer structure. In this arrangement, the HRT layer can prevent the deterioration of the AZO with additional oxygen during the $CdCl_2$ treatment. Additional Oxygen incorporation into the AZO has been shown to decrease the conductivity.

Additionally, the HRT layer may also serve to prevent the diffusion of contaminants in the polyimide layer from migrating into the lower active layers of the cell. The benefits of the first and second barrier configurations are not mutually exclusive and may be additive to varying degrees with a single cell arrangement. In other words, for example, when configured in the first barrier arrangement, the HRT layer may provide the benefits of both the first and second arrangements, though in different proportions. A cell embodiment showing high efficiency results was fabricated using the second method. Alternatively, $Al_2O_3$ and $SiO_2$ are examples of alternative diffusion barrier materials to ZnO which may be used in the embodiments described herein.

The RF magnetron sputtering process further influences cell efficiency. Favorable results have been achieved in the various embodiments of the photovoltaic cells described herein when a larger than normal distance is used between the magnetron target and the substrate. The distance used by the inventors is larger than conventionally applied by industry or researchers, and in one embodiment, the target-substrate distance may be about 3 inches for a 2-inch diameter sputtering target. This relationship may vary and may be dependent on factors such as, for example, the target size, target geometry, substrate geometry, magnetic field sputter source, and the sputtering gas pressure. This increased distance between the target and the substrate reduces ion bombardment damage to the substrate. Similarly, a higher than normal sputter gas pressures also helps to control ion bombardment and prevent substrate damage. Additionally, use of an unbalanced magnetron field is beneficial due to somewhat higher electron and ion bombardment flux onto the substrate. It should be noted, however, that the higher flux levels are beneficial so long as the kinetic energy is not too high, such as more than about 10 electron volts.

In an embodiment of the method of the invention, the photovoltaic cell of FIG. 1A, for example, is assembled through the sputtered deposition of the layers shown. In a first step of the process, the superstrate, which may be a polyimide film, is cleaned (for example, by ultrasonic cleaning). The film is introduced into a high vacuum deposition system to form the TCO portion of the bilayer. A target is introduced into the chamber. During the loading of the chamber, atmosphere which includes water vapor, is also introduced. While not wishing to be bound by theory, the inventors herein believe that the water vapor and/or residual ambient oxygen may add a source of oxygen to prevent $O_2$ depletion during the initial stages of the sputtering process if the chamber is opened for loading. Different characteristics may be found if a load lock is used for substrate loading and unloading.

In one embodiment, the target is a ceramic composed of approximately 98% ZnO and 2% $Al_2O_3$. The target is ionically bombarded by way of an RF magnetron sputtering gun using a pure Ar gas stream. The sputtering process applies the argon as a plasma onto the target. The impact of the argon plasma ejects ZnO and $Al_2O_3$ from the target and impinges these materials onto the superstrate. During the sputtering process, oxygen may be depleted from the target materials. Such a depletion of oxygen would allow pure metallic Zn and Al, for example, to be deposited onto the superstrate. Such a construction reduces the transparency of the TCO layer resulting in a reduced performance and efficiency. The TCO layer, generally, is an oxide layer that is electrically conductive and transparent to photons that are, for example, in the visible and near infrared spectrum. Thus, the introduction of water vapor, or any other source of oxygen, may prevent deposition of metallic elements onto the superstrate. The TCO layer is built up by depositing ZnO onto the superstrate. During the doping of the ZnO material, elemental aluminum is generated and substitutes for Zn in the crystal lattice structure of the TCO layer. In the substitution of aluminum for zinc on the zinc lattice sites of the crystal structure, an $Al^+$ ion core is formed which has a net positive charge that weakly binds an electron due to aluminum's valence of 3 and zinc's valence of 2. This gives the ZnO:Al mobile electron charge carriers. This net charge provides the electrical conductivity of the layer without blocking the transparency of the layer.

Once the desired TCO layer has been applied, an additional source of oxygen is introduced into the argon stream to initiate the build up of the HRT layer. By introducing oxygen in sufficient quantities, the aluminum is affirmatively oxidized to preserve $Al_2O_3$, which provides the insulating capability of the HRT portion of the bilayer. Once the TCO/HRT bilayer is formed, the specimen is removed from the deposition system.

The specimen is then placed in a sputtering chamber to begin the buildup of the n and p active layers. The second sputtering chamber is "load locked" meaning that atmosphere is substantially evacuated from the chamber to reduce or eliminate potential contaminants, including $O_2$. In one embodiment shown in FIGS. 1A-1C, a CdS layer is RF sputtered onto the specimen. The sputtering gas may be pure argon, for example, but may also include other noble or otherwise inert gasses. In one embodiment, the CdS layer is built up to approximately 100 nm thickness. Then, a CdTe layer is RF sputtered in a similar manner to the CdS layer. These steps form the active layer pre-forms.

As pre-formed layers, the current state of the active layers is one of a crystalline structure having small grain sizes and defects. The structure of the active layers is not conducive to produce high efficiency photovoltaic cells in this state. Thus, a subsequent chloride treatment of the active layers, using for example $CdCl_2$, recrystallizes the CdTe active layer to smooth out the structure and passivate defects. Without being bound by a specific theory, the $CdCl_2$ is thought to act as a fluxing agent by way of the reactive nature of the chlorine. Thus, other chloride agents may be used other than $CdCl_2$. The balancing of the reactive chloride treatment parameters (for example, chloride concentrations, exposure times, and processing temperatures) allows for effective recrystallization of the CdTe layer while minimizing the deleterious effects of those parameters to the transmissibility of the superstrate in the desired light wavelength spectrum. The chloride treatment process may also degrade the conductivity of the TCO layer.

While the invention has been described with reference to various and preferred embodiments, it should be understood by those skilled in the art that various changes may be made and equivalents may be substituted for elements thereof without departing from the essential scope of the invention. In addition, many modifications may be made to adapt a particular situation or material to the teachings of the invention without departing from the essential scope thereof.

Therefore, it is intended that the invention not be limited to the particular embodiment disclosed herein contemplated for carrying out this invention, but that the invention will include all embodiments falling within the scope of the claims.

The publication and other material used herein to illuminate the invention or provide additional details respecting the practice of the invention, are incorporated by reference herein.

What is claimed is:

1. A method of making a photovoltaic cell comprising:
   providing a superstrate layer comprising a polyimide material having a first light transmission characteristic, as measured in light transparency;
   depositing a transparent conductive oxide (TCO) layer having a first sheet resistance characteristic, as measured in ohms, onto the superstrate layer;
   depositing a highly resistive transparent (HRT) material onto the TCO layer under process conditions that substantially avoid degradation of the TCO layer, in which the TCO layer has a first electrical sheet resistance between about 5 and 8 ohms and a transparency of visible light greater than about 85%;
   depositing a semiconductor junction having at least an n-type layer and at least a p-type layer onto the HRT material under process conditions that avoid substantial degradation of the HRT material;
   exposing the semiconductor junction to a $CdCl_2$ treatment sufficient to i) cause the superstrate layer to take on a second light transmission characteristic, and ii) cause the TCO layer to take on a second sheet resistance characteristic;
   the at least one of the second light transmission characteristic and the second sheet resistance characteristic permitting a photovoltaic cell efficiency of at least about 9%; and
   applying a back electrode coating layer.

2. The method of claim 1, wherein the step of exposing the semiconductor junction to the $CdCl_2$ treatment is controlled such that one of a treatment temperature and a treatment exposure time causes one of:
   i) the second light transmission characteristic to be about 90% of the first light transmission characteristic in a range of about 600 nm to about 800 nm of light wavelength; and
   ii) the second sheet resistance to increase at greater than a linear rate from the first sheet resistance characteristic.

3. The method of claim 2, wherein the treatment temperature is in a range of about 350° C. to about 400° C.

4. The method of claim 2, wherein the treatment exposure time is in a range of about 15 minutes to about 60 minutes.

5. The method of claim 1, wherein the step of providing the superstrate layer includes providing the polyimide material as a free-standing sheet material.

6. The method of claim 1, wherein the step of depositing the TCO layer includes forming the TCO layer from one or more of ZnO, ZnS, CdO, $SnO_2$:F, $In_2O_3$:Sn (ITO), and $CdSn_2O_4$.

7. The method of claim 1, wherein the step of depositing the highly resistive transparent (HRT) material includes introducing an inert gas stream having oxygen therein during a sputtering of the HRT material onto the TCO layer.

8. The method of claim 7, wherein the HRT material forms a HRT layer by reacting with a TCO precursor that includes one of a Zn, Al, and O element.

9. The method of claim 1, wherein the semiconductor junction is deposited with a sputtering process.

10. The method of claim 1, comprising:
    sputtering the polyimide material with a TCO precursor material by way of an RF sputtering technique using a magnetron gun having an unbalanced field to form the TCO layer, the RF sputtering technique including an argon gas stream including oxygen; and
    sputtering the HRT material onto the TCO layer by introducing an additional source of oxygen content that reacts with the TCO precursor material to form the HRT layer.

11. The method of claim 10 wherein the step of sputtering the polyimide material with a TCO precursor material includes adding oxygen present in air.

12. The method of claim 10 wherein the step of sputtering the HRT material onto the TCO layer includes adding oxygen in an amount less than or equal to about 6%.

13. The method of claim 10 wherein the TCO precursor material and the HRT material form a TCO/HRT bilayer.

14. The method of claim 13, wherein the TCO/HRT bilayer comprises a ZnO:Al/ZnO bilayer where the ZnO:Al portion functions as the TCO layer and the undoped portion of ZnO functions as the HRT layer.

15. The method of claim 14, wherein the TCO precursor material and the HRT material are intermixed to form a generally seamless TCO/HRT bilayer.

16. The method of claim 10, wherein the unbalanced magnetron field provides flux levels wherein the kinetic energy is not more than about 10 electron volts.

17. The method of claim 1, wherein the step of providing the superstrate layer includes providing the polyimide material as a polyimide film cast onto a glass fixture.

18. The method of claim 1, wherein the step of the $CdCl_2$ treatment includes raising the temperature to less than 400 degrees C. and less than 40 minutes exposure time to the $CdCl_2$ vapors.

19. The method of claim 1, wherein the step of providing the TCO layer is the step of providing a ZnO layer doped with at least one of an aluminum material or an aluminum oxide material as the TCO layer and the step of providing the $CdCl_2$ treatment includes treating the TCO layer such that the TCO increases an electrical resistance characteristic.

20. A photovoltaic cell having a polyimide front window, a TCO/HRT bilayer, an n-type layer, a p-type layer, and a back contact formed by the method of claim 1.

21. The method of claim 1, wherein the HRT material is comprised of an undoped ZnO material or $Al_2O_3$ material to provide an HRT layer with both an electrical isolation characteristic and a chemical diffusion barrier characteristic.

22. The method of claim 1, wherein the step of depositing the TCO layer includes forming the TCO layer from ZnO doped with Al.

23. A photovoltaic cell comprising:
a superstrate layer comprised of a polyimide material having a first light transmission characteristic, as measured in light transparency;
a transparent conductive oxide (TCO) layer on the superstrate layer, the TCO layer having a first electrical sheet resistance between about 5 and 8 ohms and a transparency of visible light greater than about 85%;
a highly resistive transparent (HRT) material on the TCO layer,
a semiconductor junction having at least an n-type layer and at least a p-type layer deposited on the HRT material, the semiconductor junction having been exposed to a $CdCl_2$ treatment sufficient to i) cause the superstrate layer to take on a second light transmission characteristic, and ii) cause the TCO layer to take on a second sheet resistance characteristic; the at least one of the second light transmission characteristic and the second sheet resistance characteristic permitting a photovoltaic cell efficiency of at least about 9%; and
a back electrode coating layer on the p-type semiconductor layer.

24. The photovoltaic cell of claim 23, wherein the TCO layer includes one or more of ZnO, ZnS, CdO, $SnO_2$:F, $In_2O_3$:Sn (ITO), and $CdSn_2O_4$.

25. The photovoltaic cell of claim 23, wherein the HRT material forms a HRT layer that includes oxygen introduced therein during a sputtering of the HRT material onto the TCO layer.

26. The photovoltaic cell of claim 25, wherein the TCO layer and the HRT layer are present as a TCO/HRT bilayer.

27. The photovoltaic cell of claim 26, wherein the TCO/HRT bilayer comprises a ZnO:Al/ZnO bilayer where the ZnO:Al portion functions as the TCO layer and the undoped portion of ZnO functions as the HRT layer.

28. The photovoltaic cell of claim 25, wherein the HRT layer includes oxygen reacted with a TCO precursor, the TCO precursor comprising one of a Zn, Al, and O element.

29. The photovoltaic cell of claim 23, wherein the TCO layer comprises a ZnO layer doped with at least one of an aluminum material or an aluminum oxide.

30. The photovoltaic cell of claim 23, wherein the HRT material is comprised of an undoped ZnO material or $Al_2O_3$ material to provide an HRT layer having both an electrical isolation function and a chemical diffusion barrier function.

31. The photovoltaic cell of claim 23, wherein the TCO precursor material and the HRT material are intermixed to form a generally seamless TCO/HRT bilayer.

* * * * *